United States Patent

Mokerji

Patent Number: 6,090,490
Date of Patent: *Jul. 18, 2000

[54] ZIRCONIUM COMPOUND COATING HAVING A SILICONE LAYER THEREON

[75] Inventor: Subrata Mokerji, Shelby Township, Mich.

[73] Assignee: MascoTech, Inc., Taylor, Mich.

[*] Notice: This patent issued on a continued prosecution application filed under 37 CFR 1.53(d), and is subject to the twenty year patent term provisions of 35 U.S.C. 154(a)(2).

[21] Appl. No.: 08/904,681

[22] Filed: Aug. 1, 1997

[51] Int. Cl.[7] .......................... B32B 15/08; B32B 27/30; B32B 27/32; B32B 27/36

[52] U.S. Cl. .......................... 428/412; 428/447; 428/451; 428/458; 428/460; 428/461; 428/463; 428/472; 428/621; 428/622; 428/623; 428/624; 428/625; 428/626; 428/627; 428/628; 428/629; 428/698

[58] Field of Search .................................... 428/447, 451, 428/460, 461, 463, 412, 458, 472, 621, 622, 623, 624, 625, 626, 627, 628, 629, 698

[56] References Cited

U.S. PATENT DOCUMENTS

| | | | |
|---|---|---|---|
| Re. 34,173 | 2/1993 | Kerber | 428/610 |
| 3,838,512 | 10/1974 | Sanderson | 30/346.54 |
| 3,977,839 | 8/1976 | Palisin, Jr. | 29/195 |
| 4,109,052 | 8/1978 | Anderson | 428/409 |
| 4,148,967 | 4/1979 | Satoh et al. | 428/416 |
| 4,305,981 | 12/1981 | Muroi et al. | 428/421 |
| 4,321,299 | 3/1982 | Frazer | 428/247 |
| 4,369,225 | 1/1983 | Manabe et al. | 428/334 |
| 4,374,717 | 2/1983 | Drauglis et al. | 204/192 C |
| 4,911,811 | 3/1990 | Mullaney, Jr. | 204/192.14 |
| 4,931,366 | 6/1990 | Mullaney, Jr. | 428/622 |
| 5,510,164 | 4/1996 | Best et al. | 428/64.1 |
| 5,589,280 | 12/1996 | Gibbons et al. | 428/458 |
| 5,656,335 | 8/1997 | Schwing et al. | 427/447 |

*Primary Examiner*—D. S. Nakarani
*Attorney, Agent, or Firm*—Myron B. Kapustij; Lloyd D. Doigan

[57] ABSTRACT

An article is coated with a multi-layer coating comprising a polymeric layer deposited on the surface of the article, a zirconium compound, titanium compound or zirconium/titanium alloy compound layer deposited on the polymeric layer, and a silicone resin layer deposited on the zirconium compound or titanium compound layer.

38 Claims, 1 Drawing Sheet

ZIRCONIUM COMPOUND COATING HAVING A SILICONE LAYER THEREON

FIELD OF THE INVENTION

The instant invention relates to a substrate having a leveling plastic coating thereon, a decorative zirconium compound layer on the plastic coating, and a protective silicone coating over the zirconium compound layer.

SUMMARY OF THE INVENTION

In accordance with this invention a plastic basecoat is provided on the surface of the substrate. The polymeric basecoat provides a leveling effect to the surface of the substrate. A decorative zirconium compound, titanium compound, or zirconium/titanium alloy compound layer is then applied onto the basecoat. A protective silicone resin top coat is provided over the zirconium compound or titanium compound layer.

BACKGROUND OF THE INVENTION

Thin zirconium compound or titanium compound layers have been applied by vapor deposition onto the surfaces of various substrates to provide a decorative and shiny appearance thereto. However, the substrates have had to be pretreated as by drying, polishing, cleaning and the like to remove any stains, spots, scratches or other imperfections from their surfaces before the zirconium compound or titanium compound layer is applied thereon. Otherwise, the zirconium compound or titanium compound layer will enhance and accentuate these imperfections. Also, the zirconium compound or titanium compound layer, while quite hard, is nevertheless subject to abrasion, scratching and weathering, particularly if it is applied onto a part of a vehicle such as, for example, a wheel cover.

The present invention provides a substrate having a decorative zirconium compound or titanium compound layer which is not subject to the afore-mentioned disadvantages.

DESCRIPTION OF THE PREFERRED EMBODIMENT

Figure 1:
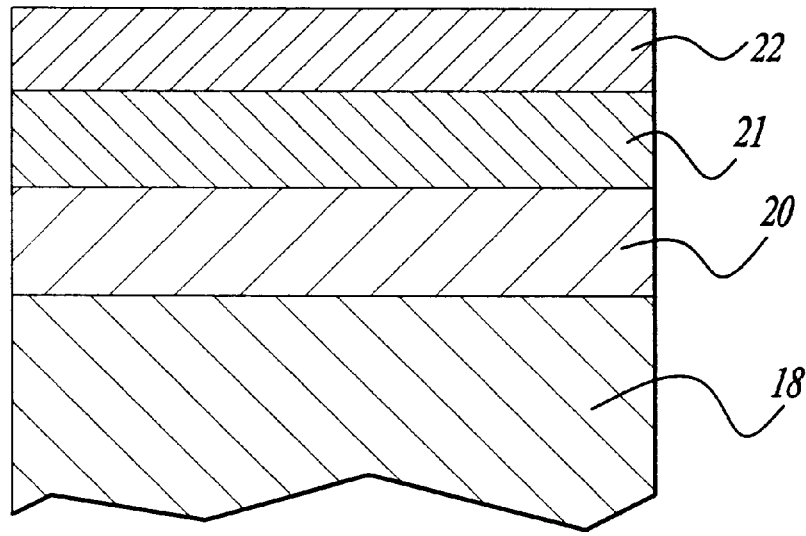
FIG. 1 is a cross-sectional view, not to scale of a portion of the substrate having the multi-layer coating on its surface.

The article or substrate 18 can be comprised of any suitable material such as plastic, ceramic, metal or metal alloy. The metals include nickel, aluminum, copper, steel and zinc. The metal alloys include nickel alloys and brass. The plastics forming the substrate include polycarbonates, nylon, acrylonitrile-butadiene-styrene, polyesters, polyvinylchlorides, and the like. In one embodiment the article is part of a vehicle, such as for example, a wheel cover.

Over the surface of the substrate 18 is deposited a polymeric or resinous layer 20. The polymeric or resinous layer or basecoat 20 may be comprised of both thermoplastic and thermoset polymeric or resinous material. These polymeric or resinous materials include the well known, conventional and commercially available polycarbonates, polyacrylates, polymethacrylates, nylons, polyesters, polypropylenes, polyepoxies, alkyds and styrene containing polymers such as polystyrene, styrene-acrylonitrile (SAN), styrene-butadiene, acrylonitrile-butadiene-styrene (ABS), and blends and copolymers thereof.

The polycarbonates are described in U.S. Pat. Nos. 4,579,910 and 4,513,037, both of which are incorporated herein by reference.

Nylons are polyamides which can be prepared by the reaction of diamines with dicarboxylic acids. The diamines and dicarboxylic acids which are generally utilized in preparing nylons generally contain from two to about 12 carbon atoms. Nylons can also be prepared by additional polymerization. They are described in "Polyamide Resins", D. E. Floyd, Reinhold Publishing Corp., New York, 1958, which is incorporated herein by reference.

The polyepoxies are disclosed in "Epoxy Resins", by H. Lee and K. Neville, McGraw-Hill, New York, 1957, and in U.S. Pat. Nos. 2,633,458; 4,988,572; 4,680,076; 4,933,429 and 4,999,388, all of which are incorporated herein by reference.

The polyesters are polycondensation products of an aromatic dicarboxylic acid and a dihydric alcohol. The aromatic dicarboxylic acids include terephthalic acid, isophthalic acid, 4,4'-diphenyl-dicarboxylic acid, 2,6-naphthalenedicarboxylic acid, and the like. Dihydric alcohols include the lower alkane diols with from two to about 10 carbon atoms such as, for example, ethylene glycol, propylene glycol, cyclohexanedimethanol, and the like. Some illustrative non-limiting examples of polyesters include polyethylene terephthalate, polybutylene terephthalate, polyethylene isophthalate, and poly(1,4-cyclohexanedimethylene terephthalate). They are disclosed in U.S. Pat. Nos. 2,465,319; 2,901,466 and 3,047,539, all of which are incorporated herein by reference.

The polyacrylates and polymethacrylates are polymers or resins resulting from the polymerization of one or more acrylates such as, for example, methyl acrylate, ethyl acrylate, butyl acrylate, 2-ethylhexyl acrylate, etc., as well as the methacrylates such as, for instance, methyl methacrylate, ethyl methacrylate, butyl methacrylate, hexyl methacrylate, etc. Copolymers of the above acrylate and methacrylate monomers are also included within the term "polyacrylates or polymethacrylates" as it appears herein. The polymerization of the monomeric acrylates and methacrylates to provide the polyacrylate resins useful in the practice of the invention may be accomplished by any of the well known polymerization techniques.

The styrene-acrylonitrile and acrylonitrile-butadiene-styrene resins and their preparation are disclosed, inter alia, in U.S. Pat. Nos. 2,769,804; 2,989,517; 2,739,142; 3,991,136 and 4,387,179, all of which are incorporated herein by reference.

The alkyd resins are disclosed in "Alkyd Resin Technology", Patton, Interscience Publishers, NY, N.Y., 1962, and in U.S. Pat. Nos. 3,102,866; 3,228,787 and 4,511,692, all of which are incorporated herein by reference.

These polymeric materials may optionally contain the conventional and well known fillers such as mica, talc and glass fibers.

The polymeric layer or basecoat 20 may be applied onto the surface of the substrate by any of the well known and conventional methods such as dipping, spraying and brushing.

The polymeric layer 20 functions, inter alia, to level the surface of the substrate, cover any scratches or imperfections in the surface and provide a smooth and even surface for the deposition of the chrome layer.

The polymeric base layer or basecoat 20 has a thickness at least effective to level out the surface of the substrate. Generally, this thickness is from about 0.1 mil to about 10 mils, preferably from about 0.2 mil to about 5 mils, and more preferably from about 0.3 mil to about 1.5 mils.

The zirconium compound, titanium compound, or zirconium/titanium alloy compound layer 21 consists of the nitrides, oxides, carbides and carbonitrides, preferably the nitrides and carbonitrides, of zirconium, titanium, or zirconium/titanium alloy. The more preferred zirconium compounds, titanium compounds, and zirconium/titanium alloy compounds are zirconium nitride, titanium nitride, and zirconium/titanium alloy nitride. Also included within the scope of the term zirconium compound or titanium compound are compounds of alloys of zirconium and titanium. Thus, the preferred zirconium compound and titanium compound are zirconium nitride, zirconium carbonitride, titanium nitride, titanium carbonitride, zirconium/titanium alloy carbonitride, and zirconium/titanium alloy nitride, with the nitrides being more preferred.

The alloys of zirconium and titanium typically contain, in percent by weight, from about 10% titanium and 90% zirconium to about 90% titanium and 10% zirconium, preferably from about 15% to about 85% titanium and about 85% to about 15% zirconium.

The layer 21 can be deposited by conventional and well known vapor deposition techniques such as physical vapor deposition processes. The physical vapor deposition processes include reactive sputtering or reactive cathodic arc deposition. Reactive cathodic arc evaporation and reactive sputtering are generally similar to ordinary sputtering and cathodic arc evaporation except that a reactive gas is introduced into the chamber which reacts with the dislodged target material. Thus, in the case where zirconium nitride is the layer 21, the cathode is comprised of zirconium and nitrogen is the reactive gas introduced into the chamber. By controlling the amount of nitrogen available to react with the zirconium, the color of the zirconium nitride can be adjusted to be similar to that of brass of various hues.

In the case where zirconium carbonitride is the layer 21, the cathode is comprised of zirconium and nitrogen, methylene or acetylene are the reactive gases introduced into the chamber. The zirconium carbonitride, titanium carbonitride or zirconium/titanium alloy carbonitride give the appearance of black chrome.

Sputtering techniques and equipment are disclosed, inter alia, in J. Vossen and W. Kern "Thin film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Briefly, in the sputtering deposition process a metal (such as titanium or zirconium) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as zirconium or titanium. The arc vaporizes the cathode material, which then condenses on the substrates forming a coating.

Layer 21 has a thickness which is at least effective to provide a decorative coating of a specific color. In the case of zirconium nitride it is a brass color. In the case of titanium nitride it is a gold color. In the case of zirconium carbonitride it has the appearance of black chrome. The thickness of layer 21 is also a thickness at least effective to provide abrasion and corrosion resistance to the underlying substrate. Generally this thickness is at least about 300 Angstroms, preferably at least about 2,000 Angstroms, and more preferably at least about 3,500 Angstroms. The upper thickness range is generally not critical but is controlled by secondary considerations such as cost and the like. Generally, however, a thickness above about 3 microns, preferably above about 2 microns, and more preferably above about 0.5 microns should not be exceeded.

In another embodiment of the instant invention a zirconium, titanium, or zirconium/titanium alloy strike layer is vapor deposited between the zirconium compound, titanium compound or zirconium/titanium alloy compound layer 21 and the polymeric layer 20. The strike layer functions, inter alia, to improve the adhesion of the non-precious refractory metal compound layer 21 to the polymeric layer 20. The strike layer is comprised of the same non-precious refractory metal as the non-precious refractory metal compound layer 21. Thus if layer 21 is comprised of a zirconium compound such as zirconium nitride or zirconium carbonitride the strike layer is comprised of zirconium; if layer 21 is comprised of a titanium compound such as titanium nitride or titanium carbonitride the strike layer is comprised of titanium; and if layer 21 is comprised of zirconium/titanium alloy compound the strike layer is comprised of zirconium/titanium alloy.

The strike layer has a thickness at least effective to improve the adhesion of layer 21 to layer 20. Generally, this thickness is from about 30 Angstroms to about 1 micron, preferably from about 200 Angstroms to about 1 micron, and more preferably from about 350 Angstroms to about 0.25 microns.

The strike layer can be applied onto the polymeric layer 20 by conventional vapor deposition processes such as sputtering and cathodic arc evaporation.

In another embodiment of the instant invention layer 21, instead of being a monolithic layer comprised of zirconium compound, titanium compound or zirconium/titanium alloy compound, is a sandwich layer comprised of a plurality of alternating layers of zirconium compound, titanium compound, or zirconium/titanium alloy compound. Thus, for example, layer 21, instead of being comprised of zirconium compound, can be comprised of alternating layers of zirconium nitride and titanium nitride. The number of alternating zirconium compound and titanium compound layers can be from about 2 to about 10. Thus, for example, layer 21 can contain two zirconium nitride layers alternating with two titanium nitride layers, i.e., zirconium nitride layer/titanium nitride layer/zirconium nitride layer/titanium nitride layer. The total thickness of layer 21 is as set forth supra. The thickness of each individual zirconium compound or titanium compound layer is generally from about 30 Angstroms to about 1.5 microns, preferably from about 200 Angstroms to about 1 micron, and more preferably from about 350 Angstroms to about 0.25 micron.

Figure 2:
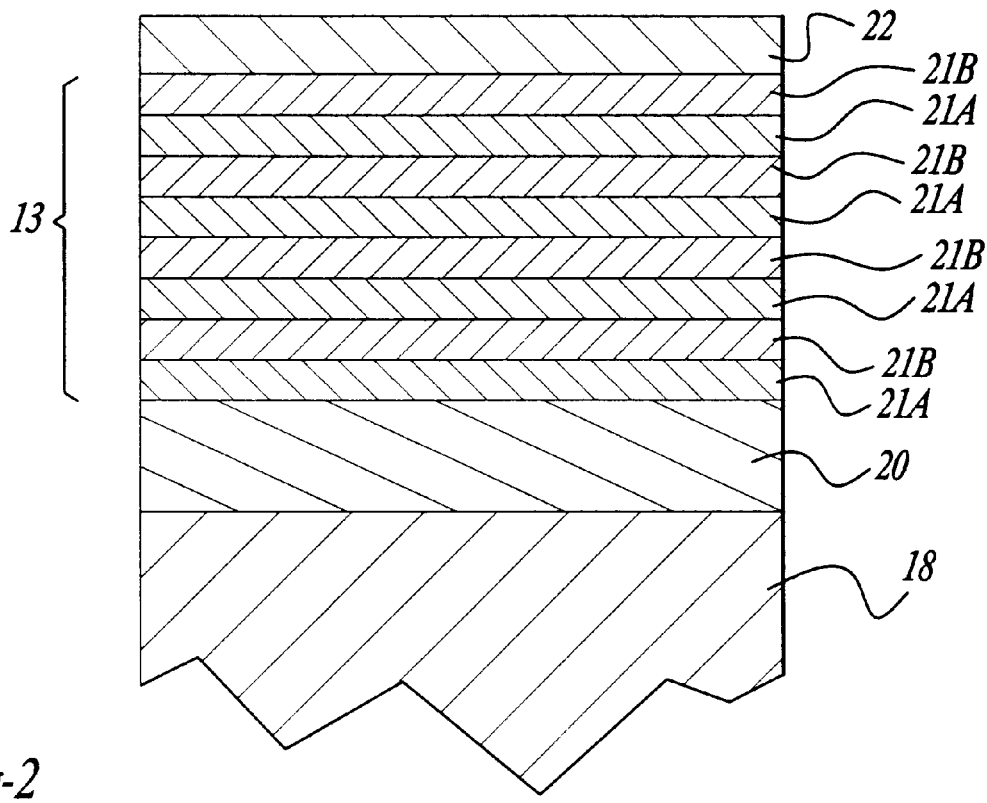
FIG. 2 is a cross-sectional view, not to scale, of a portion of the substrate showing another embodiment of the multi-layer coating.

FIG. 2 illustrates the embodiment where layer 21, instead of being monolithic, is a sandwich layer comprised of a plurality of alternating zirconium compound and layers 21A and titanium compound layers 21B. In FIG. 2 there are illustrated four zirconium compound layers 21A alternating with four titanium compound layers 21B.

The top coat 22 which is applied over the zirconium compound or titanium compound layer 21 should ideally be weather resistant, impact resistant, abrasion resistant, flexible and transparent. The term "transparent" is defined as a coating through which the chrome layer can be seen. It is preferred that the transparent coating be substantially colorless so that the esthetic effects of layer 21 are not substantially decreased. However, in some instances the addition of color to the transparent layer can be esthetically beneficial. A polymeric or resinous coating material which exhibits a good mixture of all of these properties are silicone resins or organopolysiloxanes.

The silicone resins or organopolysiloxanes which are utilized in the instant invention are conventional, well known and generally commercially available. They are disclosed, inter alia, in U.S. Pat. Nos. 3,375,223; 3,435,001; 3,450,672; 3,790,527; 3,832,319; 3,865,766; 3,888,815; 3,887,514; 3,925,276; 3,986,997; and 4,027,073, the disclosures of which are incorporated herein by reference.

The silicone resin is applied from a top coat composition containing a further-curable organopolysiloxane and, generally, solvents for the further curable organopolysiloxane. The top coat composition may be applied by standard and conventional techniques such as spraying, brushing, etc. over the chrome layer.

To cure the further curable organopolysiloxane and form the silicone resin top coat the top coat composition is then heated at a temperature and for a time effective to cure said further curable organopolysiloxane.

One particular class of further curable organopolysiloxanes which are employed in the top coat compositions of the present invention are the partial hydrolysis and condensation products of alkoxy functional silanes, preferably alkyltrialkoxysilanes, preferably those alkyltrialkoxysilanes wherein the alkyl group contains from 1 to about 8 carbon atoms, and aryltrialkoxysilanes, preferably phenyltriakoxysilanes, or mixtures thereof, wherein the alkoxy group contains from 1 to about 8 carbon atoms, such as, for example, methoxy, ethoxy, isopropoxy, butoxy, pentoxy, hexoxy, octoxy, and the like. These further-curable organopolysiloxanes are generally prepared by a process wherein the alkyltrialkoxysilane and aryltrialkoxysilane is heated in the presence of water, wherein the molar ratio of water to total silane is at least about 1.5:1 and in the presence of an effective amount of a hydrolysis catalyst, such as a mineral acid, for example, HCl, for about 1 to about 10 hours at a temperature between ambient and reflux to produce a siloxane partial condensation product; the partial condensation product is then concentrated by heating to remove 50 to about 90 mole percent alkanol by-product and some water, and thereafter, the concentrated partial condensation product is pre-cured by heating at a temperature below the gel point thereof and generally in the range of about 70° to 300° C. to produce the solvent-soluble, further curable organopolysiloxane. This pre-cured solvent-soluble, further curable organopolysiloxane is then dissolved in a suitable solvent to form the top-coat composition and the chrome layer 21 is then coated with this top coat composition. The solvent is then evaporated and the residual further curable organopolysiloxane is cured to a thermoset state to provide a top coat. The curing is effected at elevated temperatures in the range of about 50° to 135° C. for times between about 1 hour to about 72 hours, depending on the temperature at which the cure is effected. The silicone top coat generally should be cured preferably at an elevated temperature to effect the proper cure.

One particular further curable organopolysiloxane that can be employed in the top coat composition of the instant invention is the partial hydrolysis and condensation product of methyltriethoxysilane. This further curable organopolysiloxane is prepared by hydrolyzing methyltriethoxysilane with water in the presence of an effective amount of a hydrolysis catalyst, such as HCl, for about 1 to 10 hours at a temperature generally between 40° C. and reflux temperature, to product a partial condensation product. This partial condensation product is then concentrated by heating to remove some of the alkanol by-product and water. This concentrated product is then partially pre-cured at a temperature of about 70° to about 300° C. and below the gel point thereof and then solidified to provide a solid, solvent-soluble, further curable organopolysiloxane is then dissolved to a desired concentration in a suitable solvent to form the top coat composition. The top coat composition is then applied to the primed polycarbonate substrate, after which the solvent is evaporated and the further curable organopolysiloxane finally cured to provide a hard, abrasion and chemical solvent resistant, thermoset organopolysiloxane top coat on the polycarbonate substrate.

Another further curable organopolysiloxane which may be employed in the practice of the present invention is the partial hydrolysis and condensation product of a mixture of methyltriethoxysilane and phenyltriethoxysilane. This organopolysiloxane is prepared by hydrolyzing a mixture of methyltriethoxysilane and phenyltriethoxysilane with water in the presence of a hydrolysis catalyst such as HCl to produce a partial condensation product. This partial condensation product is then concentrated by heating to remove a substantial amount of the alkanol by-product and some water. This concentrated product is then partially pre-cured by heating and then solidified to provide a solid, solvent-soluble, further curable organopolysiloxane. The solid, solvent-soluble, further curable organopolysiloxane is then dissolved to a desired concentration in a suitable solvent to form the top coat composition containing a further curable organopolysiloxane. The top coat composition is then applied to the primed polycarbonate substrate, after which the solvent is evaporated and the further curable organopolysiloxane is finally cured to provide a tenaciously and durably adhered, abrasion and chemical resistant thermoset organopolysiloxane top coat on the polycarbonate substrate.

These are not the only silicones that may be utilized in the top coats of the instant invention. Also useful are silicone resins composed of trifunctional and difunctional units, silicone resins composed of trifunctional units, difunctional units and tetrafunctional units where the organo substituent groups in the trifunctional units may be selected from hydrocarbon radicals of 1 to about 8 carbon atoms and are preferably methyl, phenyl and vinyl; and wherein the organo substituent groups in the difunctional siloxy units may be selected from hydrocarbon units of from 1 to about 8 carbon atoms, preferably alkyl radicals, vinyl radicals and phenyl radicals. Such silicone resins usually have an organic to silicone atom ratio of 1:1 to 1.9:1, may have a silanol content that varies anywhere from 4 to 10 weight percent and optionally may have an alkoxy content that varies from 2 to 4%. The preparation of such silicone resins which may be utilized as top coats in the invention of the instant case are, for instance, to be found in U.S. Pat. Nos. 3,375,223; 3,435,001; 3,450,672; 3,790,527; 3,832,319; 3,865,766; 3,887,514 and 3,925,276.

These silicones may also contain fillers such as, for example, glass, talc and silica, preferably colloidal silica.

The coating compositions containing the afore-described silicones are simply brushed, dipped, sprayed or flowed on top of the primer layer that is applied to the polycarbonate substrate. The solvent, or alcohol by-product and water, present in the top coat composition is evaporated and the residual further curable organopolysiloxane is cured to form a thermoset organopolysiloxane top coat. Preferably, the further curable organopolysiloxane is cured at elevated temperatures. Although certain catalysts may be utilized to accelerate the cure of the further curable organopolysiloxane, such catalysts are not necessary if the further curable organopolysiloxane is cured by itself at the elevated temperature for a sufficient length of time.

The silicone resin layer 22 can also be applied by well known, standard and conventional chemical vapor deposition, particularly plasma enhanced chemical vapor deposition, processes and physical vapor deposition sputtering processes.

Chemical vapor deposition (CVD) is defined as the formation of a non-volatile solid film on a substrate by the reaction of vapor phase reactants that contain desired components. The gases are introduced into a reactor vessel, and decompose and react at a heated surface on the substrate to form the desired film.

CVD is generally classified into one of three types. The first two are principally predicated upon reactor pressure, and are designated as atmospheric pressure chemical vapor deposition (APCVD) or low pressure chemical vapor deposition (LPCVD).

A third category is referred to as plasma enhanced chemical vapor deposition (PECVD). Rather than relying solely on thermal energy to initiate and sustain chemical reactions, PECVD uses a radio frequency (RF) induced glow discharge or direct current or microwaves to transfer energy into the reactant gases, allowing the substrate to remain at lower temperature than in APCVD or LPCVD processes. Specifically, the plasma-inducing glow discharge is generated by the application of an RF field to a low pressure gas, thereby creating free electrons within the discharge region. The electrons gain sufficient energy from the electric field so that when they collide with gas molecules, gas-phase dissociation and ionization of the reactant gases (i.e., inducement into the plasma state) then occurs. Lower substrate temperature is the major advantage of PECVD, and provides a method of depositing films on some substrates which do not have the thermal stability to accept coating by other methods. In addition, PECVD can enhance the deposition rate when compared to thermal reactions alone, and produces films of unique compositions and properties.

Plasma enhanced chemical vapor deposition processes and reactors are disclosed, inter alia, in U.S. Pat. Nos. 5,646,435; 5,646,050; 4,888,199; 5,628,829; 5,643,364 and 5,628,869, all of which are incorporated herein by reference.

In certain situations and under certain circumstances the silicone top coat may not adhere sufficiently well or durably to the zirconium compound, titanium compound or zirconium/titanium alloy compound layer. In such case a primer layer may optionally be applied onto the zirconium compound, titanium compound or zirconium/titanium compound layer, and the silicone top coat applied over the primer layer. Polyacrylates and polymethacrylates function as effective primer layers.

The thickness of the silicone resin layer is a thickness at least effective to protect the underlying zirconium compound, titanium compound, zirconium/titanium alloy compound or sandwich layer from abrasion, scratching, and corrosion. Generally this thickness is from about 0.05 mil to about 5 mils, preferably from about 0.1 mil to about 2 mils and more preferably from about 0.2 mil to about 1 mil.

In order that the invention may be more readily understood the following example is provided. The example is illustrative and does not limit the invention thereto.

EXAMPLE 1

A steel substrate is ultrasonically cleaned and then heated at 250° F. to remove moisture. A basecoat polymeric composition is applied onto the cleaned and dried steel substrate by a standard and conventional high volume low pressure gun. The polymer is comprised of 35 weight percent styrenated acrylic resin, 30 weight percent melamine formaldehyde resin, and 35 weight percent bisphenol A epoxy resin. The polymer is dissolved in sufficient solvents to provide a polymeric composition containing about 43 weight percent solids. After the basecoat is applied onto the substrate the substrate is allowed to sit for 20 minutes for ambient solvent flash off. The substrate is then baked at 375° F. for two hours. The resulting cured polymeric basecoat has a thickness of about 0.8 mil.

The basecoated substrate is placed on a metallizing rack. The metallizing rack is placed in a metallizing carriage which is placed inside a vacuum chamber. The chamber is evacuated to a vacuum level of 5×10E-5 torr. About 800 standard cubic centimeters per minute of argon is introduced into the chamber. An electric arc is struck at the end of a zirconium/titanium alloy target. As the arc travels from the back end of the target to the front, its polarity is reversed, thereby causing the arc to move back and forth to evaporate the zirconium/titanium alloy target and deposit it on the basecoated substrate. A current of 500 amps is applied to the target. The deposition of the zirconium/titanium alloy continues for about nine minutes and a strike layer 1,000 Angstroms thick is deposited on the basecoat. After the strike layer has been deposited 800 standard cubic centimeters per minute of nitrogen are introduced into the chamber. This results in the deposition of zirconium/titanium alloy nitride onto the zirconium/titanium alloy strike layer. Deposition of zirconium/titanium alloy nitride is continued for 26 minutes. A layer of zirconium/titanium alloy nitride about 2,800 Angstroms thick, is deposited on the strike layer.

The gas flows and the arc current are turned off. The coated substrate is allowed to cool for five minutes and the chamber is vented. The metallizing carriage is removed from the vacuum chamber.

A silicone resin top coat protective layer is applied over the zirconium/titanium nitride layer. The top coat is deposited by plasma enhanced chemical vapor deposition of siloxane monomers. The siloxane monomers include hexamethyl disiloxane and trimethyl disiloxane. The metallizing carriage is placed inside a vacuum chamber, and the chamber is evacuated to a pressure of one militorr. The siloxane monomers are introduced into the vacuum chamber. The monomers, in a liquid state, are transformed into a gaseous state as they enter the vacuum chamber. The gaseous monomers are passed through a tube which has multiple openings to distribute the gas. The tube is 68 inches in length and the gas distribution openings are 1/16 inch in diameter. An electric current of 2,500 amps is passed through a resistively heat tungsten wire to generate heat. Thereafter 4,000 volts is applied on a cylindrical aluminum electrode to generate a plasma. during plasma polymerization/deposition, the monomer gas is ionized and the ions deposit on the coated substrate and polymerize and crosslink to form a silicon resin coating. The deposition is continued for one hour. The clear top coat has a thickness of four microns.

The top coated substrate has a gold appearance, and is resistant to abrasion and corrosion.

While certain embodiments of the invention have been described for purposes of illustration, it is to be understood that there may be other additional various embodiments and modifications within the general scope of the invention.

I claim:

1. An article comprising a substrate having on at least a portion of its surface a multi-layer coating comprising:
   a layer comprised of polymeric material on at least a portion of the surface of said substrate;
   a layer comprised of zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide or zirconium/titanium alloy carbonitride on said layer comprised of polymeric material; and
   a layer comprised of organopolysiloxane on said layer comprised of zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide or zirconium/titanium alloy carbonitride.

2. The article of claim 1 wherein said zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide or zirconium/titanium alloy carbonitride is zirconium nitride, titanium nitride or zirconium/titanium alloy nitride.

3. The article of claim 2 wherein said layer comprised of zirconium nitride, titanium nitride or zirconium/titanium alloy nitride is comprised of zirconium nitride.

4. The article of claim 2 wherein said layer comprised of zirconium nitride, titanium nitride or zirconium/titanium alloy nitride is comprised of titanium nitride.

5. The article of claims 1 wherein said zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide or zirconium/titanium alloy carbonitride is zirconium carbonitride, titanium carbonitride or zirconium/titanium carbonitride.

6. The article of claim 5 wherein said layer comprised of zirconium carbonitride, titanium carbonitride or zirconium/titanium alloy carbonitride is comprised of zirconium carbonitride.

7. The article of claim 5 wherein said layer comprised of zirconium carbonitride, titanium carbonitride or zirconium/titanium alloy carbonitride is comprised of titanium carbonitride.

8. The article of claim 5 wherein said layer comprised of zirconium carbonitride, titanium carbonitride or zirconium/titanium alloy carbonitride is comprised of zirconium/titanium alloy carbonitride.

9. The article of claim 1 wherein a primer layer comprised of polyacrylate or polymethacrylate is interposed between said organopolysiloxane layer and said layer comprised of zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide or zirconium/titanium alloy carbonitride.

10. The article of claim 1 wherein said polymeric material is selected from the group consisting of polycarbonate, polyester, polymethacrylate, polystyrene, acrylonitrile-butadiene-styrene, styrene-acrylonitrile, alkyd resin, polyethylene, and blends thereof.

11. The article of claim 1 wherein said article is comprised of metal.

12. The article of claim 11 wherein said article is a vehicle wheel cover.

13. The article of claim 1 wherein said article is comprised of metal alloy.

14. The article of claim 13 wherein said article is a vehicle wheel cover.

15. The article of claim 1 wherein said article is comprised of plastic.

16. The article of claim 15 wherein said article is a vehicle wheel cover.

17. An article comprising a substrate having on at least a portion of its surface a multi-layer coating comprising:
    a layer comprised of polymeric material on at least a portion of the surface of said substrate;
    a layer comprised of zirconium, titanium or zirconium/titanium alloy on said layer comprised of polymeric material;
    a layer comprised of zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide or zirconium/titanium alloy carbonitride on said layer comprised of zirconium, titanium or zirconium/titanium alloy; and
    a layer comprised of organopolysiloxane.

18. The article of claim 17 wherein said zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide, or zirconium/titanium alloy carbonitride is zirconium nitride, titanium nitride or zirconium/titanium alloy nitride.

19. The article of claim 18 wherein said layer comprised of zirconium nitride, titanium nitride or zirconium/titanium alloy nitride is comprised of zirconium nitride and said layer comprised of zirconium, titanium or zirconium/titanium alloy is comprised of zirconium.

20. The article of claim 18 wherein said layer comprised of zirconium nitride, titanium nitride or zirconium/titanium alloy nitride is comprised of titanium nitride and said layer comprised of zirconium, titanium or zirconium/titanium alloy is comprised of titanium.

21. The article of claim 17 wherein said zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide, or zirconium/titanium alloy carbonitride is zirconium carbonitride, titanium carbonitride or zirconium/titanium alloy carbonitride.

22. The article of claim 17 wherein said polymeric material is selected from the group consisting of polycarbonate, polyester, polymethacrylate, polystyrene, acrylonitrile-butadiene-sytrene, sytrene-acrylonitrile, alkyd resin, polyethylene, and blends thereof.

23. The article of claim 17 wherein said article is comprised of metal.

24. The article of claim 23 wherein said article is a vehicle wheel cover.

25. The article of claim 17 wherein said article is comprised of metal alloy.

26. The article of claim 25 wherein said article is a vehicle wheel cover.

27. The article of claim 17 wherein said article is comprised of plastic.

28. The article of claim 17 wherein a primer layer comprised of polyacrylate or polymethacrylate is interposed between said layer comprised of organopolysiloxane and said layer comprised of zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide, or zirconium/titanium alloy carbonitride.

29. An article comprising a substrate having on at least a portion of its surface a multi-layer coating comprising:
 a layer comprised of polymeric material on at least a portion of the surface of said substrate;
 a sandwich layer comprised of at least two layers comprised of zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide, or zirconium/titanium alloy carbonitride alternating with each other on said layer comprised of polymeric material; and
 a layer comprised of organopolysiloxane on said sandwich layer.

30. The article of claim 29 wherein said zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide, or zirconium titanium alloy carbonitride is zirconium nitride, titanium nitride or zirconium/titanium alloy nitride.

31. The article of claim 30 wherein said sandwich layer is comprised of alternating layers comprised of zirconium nitride and titanium nitride.

32. The article of claim 29 wherein said polymeric material is selected from the group consisting of polycarbonate, polyester, polymethacrylate, polystyrene, acrylonitrile-butadiene-styrene, styrene-acrylonitrile, alkyd resin, polyethylene, and blends thereof.

33. The article of claim 29 wherein a layer comprised of zirconium, titanium or zirconium/titanium alloy is disposed intermediate said layer comprised of polymeric material and said sandwich layer.

34. The article of claim 33 wherein said zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide, or zirconium/titanium alloy carbonitride is zirconium nitride, titanium nitride or zirconium/titanium alloy nitride.

35. The article of claim 34 wherein said sandwich layer is comprised of alternating layers comprised of zirconium nitride and titanium nitride.

36. The article of claims 33 said zirconium nitride, zirconium oxide, zirconium carbide, zirconium carbonitride, titanium nitride, titanium oxide, titanium carbide, titanium carbonitride, zirconium/titanium alloy nitride, zirconium/titanium alloy oxide, zirconium/titanium alloy carbide, or zirconium/titanium alloy carbonitride is zirconium carbonitride, titanium carbonitride, or zirconium/titanium alloy carbonitride.

37. The article of claim 33 where said polymeric material is selected from the group consisting of polycarbonate, polyester, polymethacrylate, polystyrene acrylonitrile-butadiene-styrene, styrene-acrylonitrile, alkyd resin, polyethylene, and blends thereof.

38. The article of claim 29 wherein a primer layer comprised of polyacrylate or polymethacrylate is disposed between said sandwich layer and said layer comprised of organopolysiloxane.

* * * * *